United States Patent [19]
Lu

[11] Patent Number: 6,006,827
[45] Date of Patent: Dec. 28, 1999

[54] COOLING DEVICE FOR COMPUTER COMPONENT

[75] Inventor: Chun-Hsin Lu, Taipei, Taiwan

[73] Assignee: Hon Hai Precision Ind. Co., Ltd., Taipei Hsien, Taiwan

[21] Appl. No.: 09/222,167

[22] Filed: Dec. 28, 1998

[51] Int. Cl.[6] ...................................................... F28F 1/30
[52] U.S. Cl. ...................... 165/182; 165/185; 165/104.33
[58] Field of Search ...................... 165/104.33, 104.26, 165/185, 182, 80.3; 257/715, 722; 361/700, 703; 174/15.2

[56] References Cited

U.S. PATENT DOCUMENTS

| | | | |
|---|---|---|---|
| 1,771,752 | 7/1930 | Fischer | 165/182 X |
| 1,902,350 | 3/1933 | Whitaker | 165/182 |
| 1,950,112 | 3/1934 | Jacocks | 165/182 |
| 2,400,157 | 5/1946 | Merry | 165/182 |
| 2,653,800 | 9/1953 | Anton | 165/182 |
| 2,751,528 | 6/1956 | Burton | 165/185 |
| 3,004,328 | 10/1961 | Pepper et al. | 165/182 |
| 3,372,733 | 3/1968 | Callender | 165/185 |
| 4,114,593 | 9/1978 | Guertin | 165/185 |
| 4,638,854 | 1/1987 | Noren | 165/182 X |
| 5,162,974 | 11/1992 | Currie | 165/185 X |
| 5,509,465 | 4/1996 | Lai | 165/185 X |
| 5,583,746 | 12/1996 | Wang | 165/185 X |

FOREIGN PATENT DOCUMENTS

| | | | |
|---|---|---|---|
| 1382021 | 2/1964 | France | 165/182 |
| 137352 | 9/1901 | Germany | 165/182 |
| 0089371 | 8/1978 | Japan | 165/185 |
| 0042154 | 3/1982 | Japan | 165/104.33 |
| 404079298 | 3/1992 | Japan | 165/104.33 |
| 404079299 | 3/1992 | Japan | 165/104.33 |
| 1411110 | 10/1975 | United Kingdom | 165/182 |

*Primary Examiner*—Christopher Atkinson
*Attorney, Agent, or Firm*—Wei Te Chung

[57] ABSTRACT

A cooling device for cooling a heat-generating component in a computer consists of a heat sink and a heat pipe having a portion fitted into a hole of the heat sink to be totally enclosed thereby. The heat sink consists of a number of mounting plates and heat dissipating fins alternately stacked together. Each mounting plate has two pegs on a top face thereof and two depressions in a bottom face thereof, wherein the pegs extend through a neighboring heat dissipating fin to fit into the depressions in a neighboring mounting plate, whereby the length of the heat sink can be easily adjusted by adding or reducing the number of the mounting plates and the heat dissipating fins. Thermally conductive adhesive is used between the heat sink and the heat pipe to fixedly connect them together.

10 Claims, 4 Drawing Sheets

# COOLING DEVICE FOR COMPUTER COMPONENT

BACKGROUND OF THE INVENTION

1. Field of the Invention

The present invention relates to a cooling device for a computer component, and particularly to a heat pipe/heat sink assembly suitably used in a computer for cooling a CPU or other heat generating component thereof.

2. The Prior Art

Conventionally, to cool a CPU in a computer, a heat sink is used to directly contact with the CPU thereby absorbing the heat generated therefrom and dissipating it to the air. Following the development of computer technology, the computer is getting smaller and smaller, causing the conventional manner to cool the CPU to be no longer workable since there is no space above the CPU large enough to receive the heat sink.

To solve this problem, a heat pipe is developed which has one end in contact with the CPU and the other end in contact with a heat sink in a suitable location in the computer large enough to receive the heat sink. The heat sink is formed by aluminum extrusion as an integral cuboidal block having a number of fins thereon. The heat pipe is so constructed that heat transmitting medium (for example, pure water) therein is heated by the CPU to evaporate. Then, the evaporated steam runs along the heat pipe to reach the heat sink in which the heat carried by the steam is dissipated through the heat sink so that the steam is condensed to water. The condensed water then runs alone the heat pipe back to the CPU end to absorb the heat therefrom. By such a process, heat generated by the CPU can be effectively dissipated.

Although such a conventional technology is proven to be able to work well, a further improvement is still needed since the heat sink does not entirely enclose the heat pipe so that the heat transmitted by the heat pipe cannot be effectively absorbed and dissipated by the heat sink, and the size of the heat sink cannot be arbitrarily adjusted to meet different requirements of different components needing to be cooled. To produce heat sinks with different sizes (and thus different heat dissipating capability) will increase the cost of inventory and mold.

SUMMARY OF THE INVENTION

Accordingly, an objective of the present invention is to provide a cooling device for a computer component which consists of a heat sink and a heat pipe wherein the heat sink entirely encloses the heat pipe thereby effectively absorbing and dissipating heat therefrom.

Another objective of the present invention is to provide a cooling device for a computer component which consists of a heat sink and a heat pipe wherein the length of the heat sink can be arbitrarily adjusted to meet different cooling requirements.

To fulfill the above mentioned objectives, according to one embodiment of the present invention a cooling device for a computer component consists of a heat sink and a heat pipe. The heat sink includes alternately stacked mounting plates and heat dissipating fins. Each mounting plate forms two pegs on its top face and two depressions in its bottom face and located corresponding to the pegs. A central hole is defined in each mounting plate which has a diameter slightly larger than that of the heat pipe. The pegs on one mounting plate extend through a neighboring heat dissipating fin to fit into two corresponding depressions in a neighboring mounting plate. Each heat dissipating fin defines a large hole with a size the same as the central hole of the mounting plate and in alignment therewith. A portion of the heat pipe is extended into the central and large holes of the mounting plates and heat dissipating fins to be fixed thereto by heat conductive adhesive. The length of the heat sink can be easily adjusted by increasing or reducing the number of the stacked mounting plates and heat dissipating fins. Two recesses are defined in each heat dissipating fin and two small holes are defined in each mounting plate which are aligned with the recesses, respectively. The recesses and small holes are used to fittingly receive two guide rods for facilitating the assembly of the heat sink.

DETAILED DESCRIPTION OF THE PREFERRED EMBODIMENT

Reference will now be made in detail to the preferred embodiment of the present invention.

Figure 1:
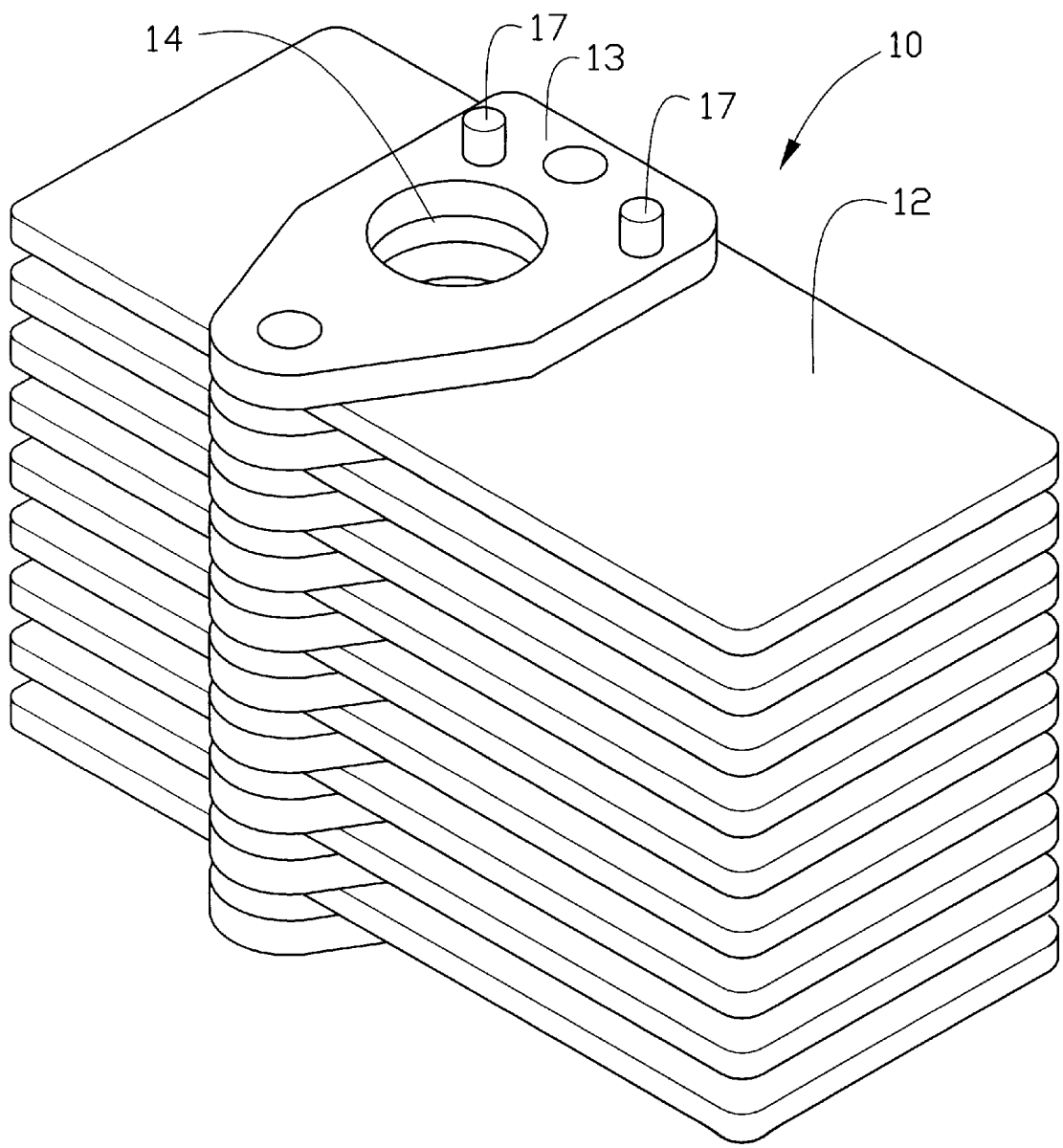
FIG. 1 is a perspective view of a heat sink in accordance with the present invention.
Figure 2:
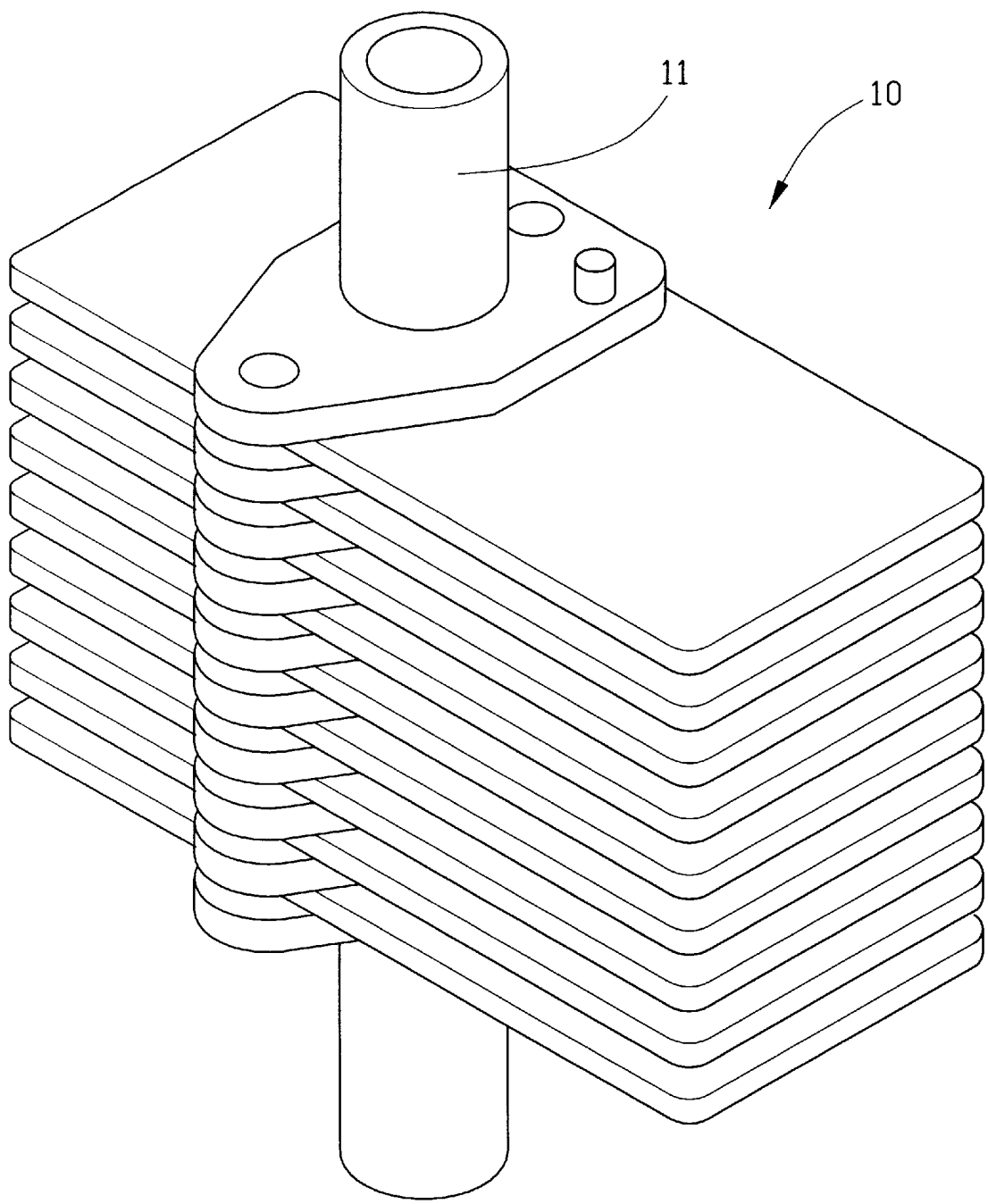
FIG. 2 is a perspective view of a cooling device for a computer component in accordance with the present invention.
Figure 3:
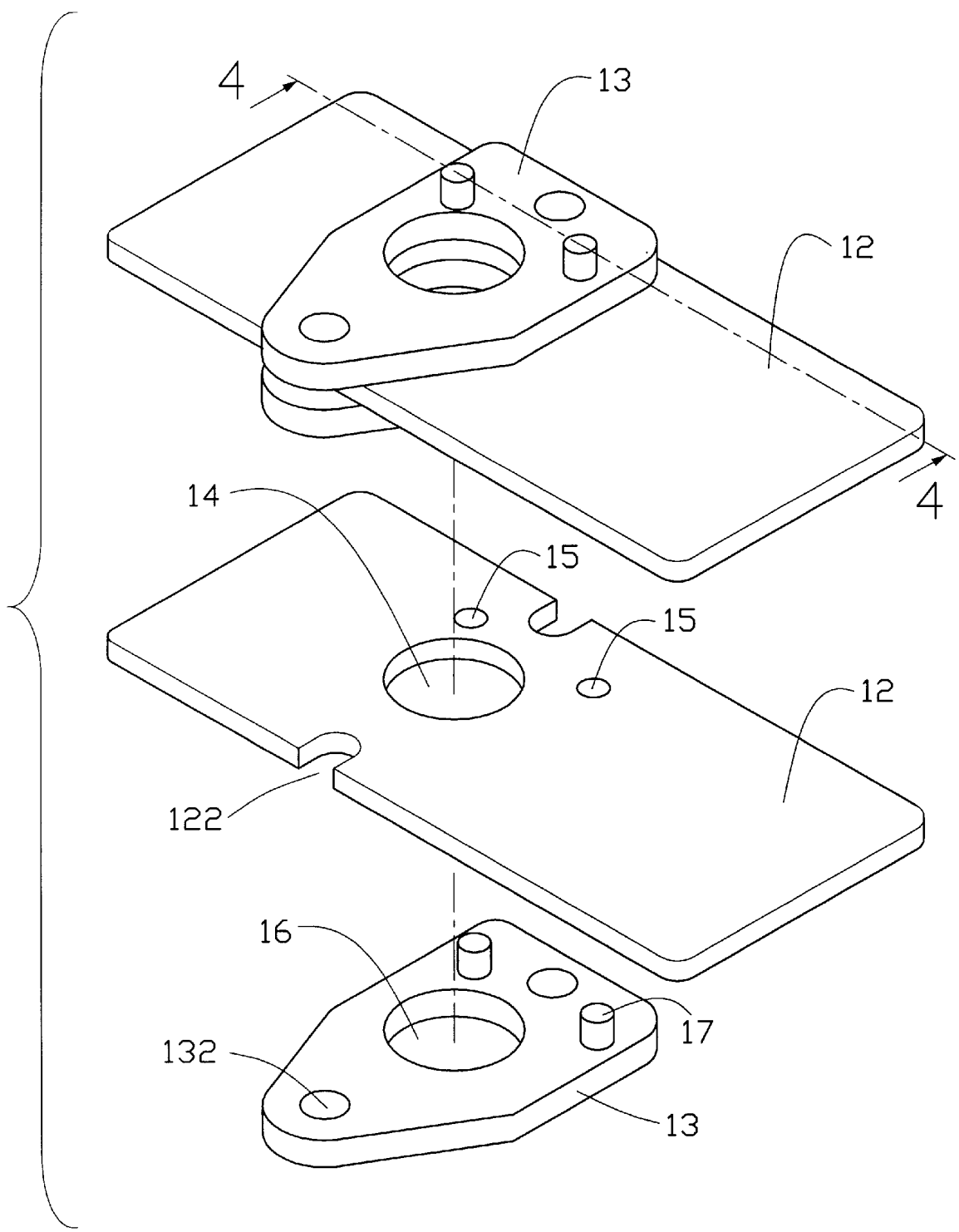
FIG. 3 is an exploded view showing components constituting the heat sink in accordance with the present invention.
Figure 4:
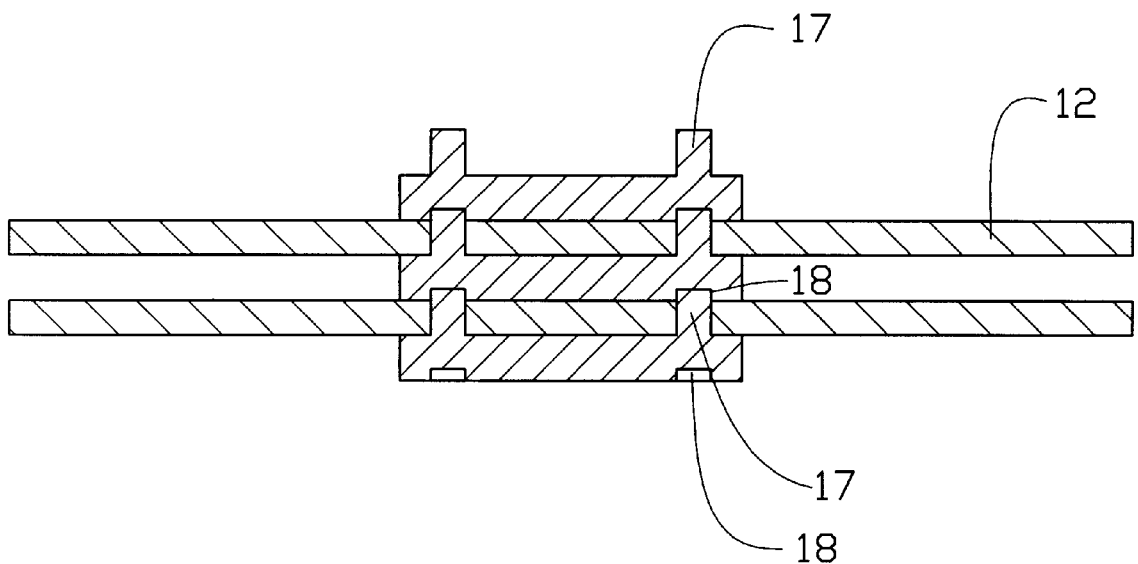
FIG. 4 is a cross-sectional view taken alone line 4—4 of FIG. 3.

Referring to FIGS. 1–4, a cooling device in accordance with the present invention for cooling a heat generating component in a computer consists of a heat sink 10 and a heat pipe 11. The heat sink 10 consists of a number of heat dissipating fins 12 and a number of mounting plates 13. Each heat dissipating fin 12 is formed by stamping a metal sheet to have a rectangular configuration defining a large hole 14 having a diameter slightly larger than that of the heat pipe 11 and two small holes 15 beside the large hole 14. Two recesses 122 are respectively defined in two opposite longitudinal sides of the fin 12 and extend toward the large hole 14.

Each mounting plate 13 is also formed by stamping a metal sheet to have a substantially pentagonal configuration defining a substantially central hole 16. The mounting plate 13 has a thickness larger than that of the fin 12. The central hole 16 has a diameter the same as that of the large hole 14 of the fin 12. Two pegs 17 are formed on a top face of the mounting plate 13 beside the central hole 16. Two depressions 18 are defined in a bottom face of the mounting plate 13 at a location corresponding to that of the pegs 17, respectively. Two small holes 132 are defined in the mounting plate 13 oppositely located beside the central hole 16, and so arranged that a line connecting the two hole 132 and a line connecting the two pegs 17 form a cross.

The heat sink 10 is assembled by alternately stacking the fins 12 and mounting plates 13 together. At the beginning of the assembling, two guide rods (not shown) are firstly inserted into two small holes 132 of a mounting plate 13 as a means for facilitating the assembling. Then, a fin 12 is assembled to the mounting plate 13 by fitting the two rods into the two recesses 122 of the fin 12 and then sliding the fin 12 alone the rods to reach a position wherein the hole 14 of the fin 12 is aligned with the hole 16 of the mounting plate 13, and the two pegs 17 extend through the two small holes 15 in the fin 12. Thereafter, a second mounting plate 13 is assembled thereto by fitting the two rods into the two small holes 132 in the second mounting plate 13 and then sliding the plate 13 alone the rods to reach a position in which the pegs 17 of the first plate 13 are fittingly extended into the two depressions 18 in the bottom face of the second plate 13. Afterwards, a predetermined number of the fins 12 and mounting plates 13 are successively mounted the sub-assembly in a manner like the above mentioned to construct the heat sink 10 with a predetermined length in order to meet a predetermined heat dissipating ability in accordance with the specification of the heat generating component to be cooled.

A clamping operation is applied to the pegs 17 of the top one of the mounting plates 13 and a bottom face of the bottom one of the mounting plates 13 thereby more securely connecting the heat sink 10 together. The guide rods are then removed from the heat sink 10. Finally, a part of the heat pipe 11 which has been coated with thermally conductive adhesive is inserted into the holes 14, 16 of the heat sink 10 to engage therewith. Thus, a cooling device for a computer component is obtained. A period of time is awaited for the adhesive to cure before the cooling device is mounted in a computer.

In the present invention, as the heat pipe 11 is totally enclosed by the heat sink 10, heat transmitted by the heat pipe 11 can be more effectively dissipated by the heat sink 10. Furthermore, as the size of the heat sink 10 can be adjusted by simply adding or reducing the number of the fins 12 and mounting plates 13, the present invention is more flexible and economic in view of meeting different cooling requirements.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

I claim:

1. A cooling device for a computer component, comprising:

a heat pipe; and a heat sink wherein a portion of the heat pipe is fitted into the heat sink to be totally enclosed thereby, the heat sink comprising a number of heat dissipating fins and a number of mounting plates alternately stacked with each other, each mounting plate comprising a peg at a top face and a depression in a bottom face thereof at a location corresponding to the peg, the peg extending through a neighboring fin to extend into a depression in a neighboring mounting plate.

2. The cooling device in accordance with claim 1, wherein thermally conductive adhesive is applied between the heat pipe and the heat sink to fixedly connect them together.

3. The cooling device in accordance with claim 1, wherein each mounting plate and each fin define a large hole aligned with each other and having a diameter substantially the same with each other, the heat pipe being fitted into these large holes.

4. The cooling device in accordance with claim 1, wherein each fin defines two recesses and each mounting plate defines two small holes aligning with the recesses, respectively, the recesses and the small holes being adapted to receive two rods for facilitating an assembling of the heat sink.

5. The cooling device in accordance with claim 4, wherein each fin has a generally rectangular shape and the two recesses are defined in two longitudinal sides of the fin, respectively.

6. The cooling device in accordance with claim 4, wherein each mounting plate has a generally pentagonal shape, and the two small holes thereof are located oppositely beside the large hole of the mounting plate.

7. The cooling device in accordance with claim 6, wherein a line connecting the two small holes of each mounting plate and a line connecting the two pegs thereof form a cross.

8. The cooling device in accordance with claim 1, wherein each mounting plate has a thickness larger than that of each heat dissipating fin.

9. The cooling device in accordance with claim 3, wherein each large hole has a diameter slightly larger than that of the heat pipe.

10. A cooling device for use with a computer, comprising:

a heat pipe; and a heat sink defining a hole through which the heat pipe extends wherein said heat sink consists essentially of a plurality of heat dissipating fins spaced from each other, a mounting plate being positioned between every two adjacent heat dissipating fins, each mounting plate comprising a peg and a depression on two opposite faces for compliance with each other and each heat dissipating fin defining a hole, so that the mounting plates can be stacked together and secure to the heat dissipating fins between every two adjacent mounting plates by means of the pegs of the mounting plates extending through the corresponding holes of the heat dissipating fins.

\* \* \* \* \*